(12) United States Patent
Lai et al.

(10) Patent No.: US 7,453,098 B2
(45) Date of Patent: Nov. 18, 2008

(54) VERTICAL ELECTRODE STRUCTURE OF GALLIUM NITRIDE BASED LIGHT EMITTING DIODE

(75) Inventors: Mu-Jen Lai, Chungli (TW); Schang-Jing Hon, Pa Te (TW)

(73) Assignee: Supernova Optoelectronics Corporation, Teoyuan County (TW)

( * ) Notice: Subject to any disclaimer, the term of this patent is extended or adjusted under 35 U.S.C. 154(b) by 176 days.

(21) Appl. No.: 11/491,124

(22) Filed: Jul. 24, 2006

(65) Prior Publication Data
US 2007/0018180 A1    Jan. 25, 2007

Related U.S. Application Data

(62) Division of application No. 10/986,126, filed on Nov. 12, 2004.

(30) Foreign Application Priority Data
Apr. 23, 2004    (TW) .............................. 93206329 U

(51) Int. Cl.
    *H01L 33/00* (2006.01)
(52) U.S. Cl. .............................. 257/98; 257/79; 257/99; 257/91; 257/103
(58) Field of Classification Search ............... 257/98, 257/79, 99, 91, 103
See application file for complete search history.

(56) References Cited

U.S. PATENT DOCUMENTS 6,469,324 B1 * 10/2002 Wang .......................... 257/98

* cited by examiner

*Primary Examiner*—Evan Pert
*Assistant Examiner*—Tan N Tran
(74) *Attorney, Agent, or Firm*—Rosenberg, Klein & Lee

(57) ABSTRACT

A vertical electrode structure of GaN-based light emitting diode discloses an oxide window layer constructing the GaN-based light emitting diode of vertical electrode structure, which effectively decreases the Fresnel reflection loss and total reflection, and further advances the luminous efficiency. Moreover, the further included metal reflecting layer causes the reflection without the selective angle of incidence, thus increasing the coverage of the reflecting angles and further reflecting the light emitted from a light emitting layer effectively. In addition, the invented structure can also advance the function of heat elimination and the electrostatic discharge (ESD) so as to the increase the operating life of the component and to be applicable to the using under the high current driving. Moreover, the vertical electrode structure of the present invention is able to lower down the manufacturing square of the chip and facilitate the post stage of the conventional wire bonding process.

6 Claims, 13 Drawing Sheets

VERTICAL ELECTRODE STRUCTURE OF GALLIUM NITRIDE BASED LIGHT EMITTING DIODE

This application is a Divisional patent application of co-pending application Ser. No. 10/986,126, filed on 12 Nov. 2004.

BACKGROUND OF THE INVENTION

1. Field of the Invention

The present invention is related to a kind of vertical electrode structure of GaN-based light emitting diode. The GaN-based light emitting diode especially refers to a kind of diode with vertical electrode structure, which can effectively reduce Fresnel refraction loss and the total reflection, and further advance the external luminous efficiency.

2. Description of the Related Art

Accordingly, the application purpose to study the blue light emitting diode is to manufacture the full-color display, traffic light, and luminescent source. Nowadays, the prevailing various light emitting diodes in the market so far are with a variety of lights including red, green, orange, and yellow lights. However, as to the blue and green light emitting diodes, the practical degrees of high efficiency and high luminescence degree are still in development. And if the InGaN, GaN, and AlInGaN can be used as basic materials combined with the already matured development of red light emitting diode to make the blue light and green light emitting diodes with high luminescence, it can achieve the purpose to produce the full-color display. In addition, the present used traffic signals of lamp have the failures of energy consuming, short life, and the phantom image of illuminating (which occurs as the sunlight reflects off the display surface and easily causes the traffic accident). Hence, if the conventional lamp can be substituted with the red, blue, and green light emitting diodes of high luminescence, it can enhance the visibility of the traffic lights significantly. The slightly improved blue light emitting diode technology can further constitute the blue light semiconductor laser, and the short wavelength blue-violet light semiconductor laser can be utilized to replace the red light semiconductor laser (optical pickup head) used in the present disk so as to increase the recording capacity of the disk at least 3 times. In other words, it is exciting that in the future, the disk with the diameter of 12 cm can bear the motion pictures of at least 3 hours. With the blue light emitting diode combined with the yttrium-aluminum-garnet fluorescent material, the blue light can be utilized to ignite the yellow fluorescent material so as to produce the yellow light, and some of the blue light would also be emitted out at the same time and mixed with the yellow light together into the white light. As the white light emitting diode has many advantages including long life, energy saving, low driving voltage, safety, and environmental conservation, it has been regarded as the light source of twenty-first century. In addition, the GaN can also be formed as UV light emitting diode with the light of short wavelength, which is affiliated to the light of high energy and can be applied into medical care, food treatment, greenhouse growing, and etc.

In the conventional technology—the GaN-based light emitting diode made of sapphire substrate—as the substrate is not conductive, it is necessary to make the lateral electrode structure. As shown in the FIG. 1, wherein the included sapphire insulating substrate 100' is epitaxized subsequently with a buffer layer 110' a N-type semiconductor layer 120', a light emitting layer 130', a P-type semiconductor layer 140', a first electrode 145', and a second electrode 122'. Besides, in the conventional art, the silicon carbide can also be adopted as the substrate of GaN-based light emitting diode. Although the silicon carbide substrate with the conductive characteristic can be made into vertical electrode, the manufacturing cost is very expensive. Therefore, until now, the insulating substrate is dominantly utilized to manufacture the GaN-based light emitting diode. However, it has to make the lateral electrode structure if adopting the insulating substrate, which contributes the unavailability of the vertical electrode. This being the case, it would take the special wire bonding apparatus and packing technology, and additionally, the manufacturing area of chip will also increase relatively, thus complicating the manufacturing process and increase the cost of each component.

As the disclosed patent of No. 480740 in Taiwan patent gazette, from FIG. 2A to FIG. 2C, the first conductive lower cladding layer 210' is formed on the first substrate 200' and then the second conductive upper cladding layer 220' is formed next to the upper lower cladding layer 210'. Then form an ohmic contact layer 230' on said upper cladding layer 220', and construct a reflection layer 240' on said ohmic contact layer 230'. Subsequently, bond a second substrate 250' on said reflection layer 240' and remove the first substrate 200', and then fabricate the first electrode and second electrode which are capable of conductivity to said upper cladding layer 220' and lower cladding layer 210' separately. Such kind of manufacturing process of light emitting diode, which is applicable of adopting insulating substrate directly, facilitates the manufacturing of the light emitting diode with vertical electrode.

SUMMARY OF THE INVENTION

The main purpose of the present invention is to offer a vertical electrode structure of a kind of GaN-based light emitting diode—the GaN-based light emitting diode, which utilizes an oxide window layer, constitutes a good ohmic contact with a N-type ohmic contact layer, conductivity and transparency. Additionally, as to the specific refraction index locates between 1.85-2.0, it can facilitate to reduce the Fresnel refraction loss and total reflection so as to advance the external luminous efficiency.

The second purpose of this invention is to offer a vertical electrode structure of a kind of GaN-based light emitting diode, wherein a metal reflection layer is used to facilitate the reflection without selective angle of incidence so as to enlarge the angle of incidence. Therefore, it is capable of effectively reflecting the light emitted from the light emitting layer and advances the function of heat eliminating and electrostatic discharge (ESD) due to vertical electrode structure. Further, its operating life can be prompted and it is applicable to the using in high current driving.

Another purpose of the present invention is to offer a vertical electrode structure of a kind of GaN-based light emitting diode, wherein the disclosed vertical electrode structure can decrease the manufacturing area of chip and facilitate the conventional wire bonding process.

To achieve the afore-mentioned purposes and advantages, the present invention is related to a vertical electrode of a kind of GaN-based light emitting diode including: a first electrode, a conductive substrate on said first electrode, a metal reflection layer with said conductive substrate there-under, a GaN-based semiconductor stacked structure with said metal reflection layer there-under, an oxide window layer on said GaN-based semiconductor stacked structure, and a second electrode with said oxide window layer there-under. The oxide window layer constructs the vertical electrode of GaN-based light emitting diode, and effectively reduce Fresnel refraction loss and total reflection, and further advances the external luminous efficiency. In addition, the further included metal reflection layer advances the reflection without selective angle of incidence, thus increasing the bandwidth of reflecting angles and effectively reflecting the light emitted from the light emitting layer. Moreover, such kind of structure can prompt the function of heat eliminating and the electrostatic discharge, so its operating life can be raised and it is applicable to the using of high current driving. Finally, the vertical electrode structure of the present invention can decrease the manufacturing area of chip and facilitate the conventional wire bonding process.

DETAILED DESCRIPTION OF THE PREFERRED EMBODIMENT

To have a further understanding about the features of the structure and the achieved effects, of the present invention, the preferred embodiment and detailed description are unfolded as following.

EXAMPLE 1

As shown in FIG. 3A, which is one of the embodiment of this invention, first of all, on a sapphire substrate 300, sequentially epitaxize a low temperature GaN buffer layer 310, a N-type AlInGaN ohmic contact layer 320, a AlInGaN light emitting layer 330, and a P-type AlInGaN ohmic contact layer 340. Following, a transparent ohmic contact metal layer 350 and a metal reflection layer 360 are subsequently formed on the P-type AlInGaN ohmic contact layer 340 by evaporating or sputtering technologies as shown in FIG. 3B. Then, the other conductive substrate 370 is bonded with the metal reflection layer 360 by thermal bonding as shown in FIG. 3C. Then, the FIG. 3D depicts that the sapphire substrate 10 is removed by laser liftoff or lapping technologies. And as shown in FIG. 3E, after laser liftoff, the remaining gallium metal on the surface of N-type AlInGaN ohmic contact layer 12 is removed by chemical etching to expose the N-type AlInGaN ohmic contact layer 320, and then, the N-type transparent metal oxide layer 380 is formed on said N-type AlInGaN ohmic contact layer 320 by evaporating or sputtering technologies. Following, a first electrode 382 and a second electrode 370 are constructed as shown in FIG. 3F. Upon finishing, fabricate the chip by conventional lapping and cutting manufacturing process. As shown in FIG. 3F, which is the depiction of complete chip structure of this invention's embodiment, wherein the N-type transparent metal oxide layer 380 can form a good ohmic contact with N-type AlInGaN ohmic contact layer 320 and has excellent conductivity and transparency—wherein the N-type transparent metal oxide layer, the main feature of the present invention, is an oxide window layer, which can be formed of the one selected from the group including indium tin oxide (ITO), indium molybdenum oxide (IMO), indium oxide, tin oxide, cadmium tin oxide, gallium oxide, indium zinc oxide, gallium zinc oxide, or zinc oxide. Additionally, as the specific refraction of 1.85-2.0, it can efficiently reduce Fresnel refraction loss and total reflection and advance the external luminous efficiency. Moreover, because of the vertical electrode structure formed of the conductive substrate 300 and metal reflection layer 360 capable of reflecting without selective angle of incidence, thus enlarging the bandwidth of the angle of incidence, it can effectively reflect the light emitted from the light emitting layer 330 and advance the function of heat eliminating and electrostatic discharge (ESD), thus prompting the operating life and being applicable to the using of high current driving.

In addition to the above-mentioned advantages, the manufacturing area of chip can be decreased by the vertical electrode structure and then facilitate the conventional wire bonding process.

EXAMPLE 2

As shown in FIG. 3A, which is another embodiment of this invention, first of all, on the sapphire substrate 300, sequentially epitaxize a low temperature GaN buffer layer 310, a N-type AlInGaN ohmic contact layer 320, a AlInGaN light emitting layer 330, and a P-type AlInGaN ohmic contact layer 340. Then a transparent ohmic contact metal layer 350 and a metal reflection layer 360 are subsequently formed on the P-type AlInGaN ohmic contact layer by evaporating or sputtering technologies as shown in FIG. 3B. As the depiction in FIG. 3C, another conductive substrate 370 is bonded with said metal reflection layer 360 by thermal bonding. Following, the sapphire substrate is removed by laser liftoff or lapping as shown in FIG. 3D. After laser liftoff, then, the remaining gallium metal on the surface of N-type AlInGaN ohmic contact layer 320 is eliminated by chemical etching to expose the N-type AlInGaN ohmic contact layer 320. Subsequently, the N-type transparent metal oxide layer 380 is formed on the N-type AlInGaN ohmic contact layer 320, and its surface is applied with texturing to construct a N-type transparent metal oxide layer 400, as shown in FIG. 4. After finishing, a first electrode 382 and a second electrode 372 are formed as shown in FIG. 4. In FIG. 4, which is the complete structure of the present invention, the structure not only can advance the function of heat eliminating but also can prompt the electrostatic discharge (ESD). Moreover, it can even increase the operating life and is suitable for the application of high current driving. Therein, the surface of the textured N-type transparent metal oxide layer 400 can be textured to further advance the external luminous efficiency.

EXAMPLE 3

As shown in FIG. 3A, which is another embodiment of the present invention, first of all, on the sapphire substrate 300, sequentially, epitaxize a low temperature GaN buffer layer 310, a N-type AlInGaN ohmic contact layer 320, a AlInGaN light emitting layer 330, and a P-type AlInGaN ohmic contact layer 340. Then a transparent ohmic contact metal layer 350 and a metal reflection layer 360 are subsequently formed on the P-type AlInGaN ohmic contact layer 340, as shown in FIG. 3B. Following, another conductive substrate 370 is bonded with said metal reflection layer 360 by thermal bonding as shown in FIG. 3C. Subsequently, the sapphire substrate 300 is removed by laser liftoff as the depiction in FIG. 3D. Then, the remaining gallium metal on the surface of the N-type AlInGaN ohmic contact layer 320 is eliminated by chemical etching to expose the N-type AlInGaN ohmic contact layer 320. And then the surface of N-type AlInGaN ohmic contact layer 320 is textured into a textured N-type AlInGaN ohmic contact layer 322 as the depiction in FIG. 5A. Following, a N-type transparent metal oxide layer 380 is formed on said N-type AlInGaN ohmic contact layer 322 as shown in FIG. 5B. Upon finishing, a first electrode 382 and a second electrode 372 are constructed as shown in FIG. 5B. FIG. 5B, which is the complete structure of the present invention's embodiment, wherein, the structure not only can advance the function of heat eliminating but also facilitate the electrostatic discharge (ESD). Moreover, it can prompt the operating life and is applicable to the using of high current driving. Therein, the surface of the textured N-type AlInGaN ohmic contact layer 322 can be textured to further advance the external luminous efficiency.

EXAMPLE 4

As shown in FIG. 3A, which is another embodiment of the present invention, first of all, on the sapphire substrate 300, sequentially epitaxize a low temperature GaN buffer layer 310, a N-type AlInGaN ohmic contact layer 320, a AlInGaN light emitting layer 330, and a P-type AlInGaN ohmic contact layer 340. Then a transparent ohmic contact metal layer 350 and a metal reflection layer 360 are subsequently formed on the P-type AlInGaN ohmic contact layer as shown in FIG. 3B. Following, another conductive substrate 370 is bonded with said metal reflection layer 360 by thermal bonding as shown in FIG. 3C. Then, the sapphire substrate is removed by laser liftoff as shown in FIG. 3D. Then as the depiction in FIG. 3D, and the remaining gallium metal on the surface of N-type AlInGaN ohmic contact layer 320 is eliminated to expose the N-type AlInGaN ohmic contact layer 320 as shown in FIG. 3E. Following, a current blocking layer 324 is constructed on the N-type AlInGaN ohmic contact layer 320 by evaporating or sputtering technologies as the depiction in FIG. 6A, and then a N-type transparent metal oxide layer 380 is formed on said N-type AlInGaN ohmic contact layer 320 and current blocking layer 324 as shown in FIG. 6B. Upon finishing, a first electrode 382 and a second electrode 372 are constructed as shown in FIG. 6C. In FIG. 6C, which is a complete structure of the present invention's embodiment, therein, the structure not only can advance the function of heat eliminating but also prompt the electrostatic discharge (ESD). Moreover, it can increase the operating life and is applicable in the using of high current driving. Wherein, said current blocking layer 324 can advance the efficiency of the horizontal current spreading, thus further prompt the external luminous efficiency.

EXAMPLE 5

As shown in FIG. 3A, which is another embodiment of the present invention, first of all, on the sapphire substrate 300, sequentially epitaxize a low temperature GaN buffer layer 310, a N-type AlInGaN ohmic contact layer 320, a AlInGaN light emitting layer 330, and a P-type AlInGaN ohmic contact layer 340. Then a transparent ohmic contact metal layer 350 is formed on the P-type AlInGaN ohmic contact layer 340 by evaporating or sputtering technologies, and then the transparent metal ohmic contact layer 350 is removed by photomask etching to construct the current blocking area 352 as the depiction in FIG. 7A. Following, a metal reflection layer 360 is formed on another conductive substrate 370, and then the conductive substrate 370 with metal reflection layer 360 is bonded with the transparent ohmic contact metal layer 15 by thermal bonding as shown in FIG. 7B. Subsequently, the sapphire substrate 300 is eliminated by laser liftoff as the depiction in FIG. 7C. Then, the remaining gallium metal on the surface of N-type AlInGaN ohmic contact layer 320 is removed by chemical etching to expose the N-type AlInGaN ohmic contact layer 320. Following, a N-type transparent metal oxide layer 380 is formed on the N-type AlInGaN ohmic contact layer 320 as shown in FIG. 7D. Upon finishing, a first electrode 382 and a second electrode 372 are constructed as the depiction in FIG. 7E. FIG. 7E is a complete structure of the present invention's embodiment, wherein the structure not only can advance the function of heat eliminating but also can prompt the electrostatic discharge (ESD). Additionally, it can prompt the operating life and is applicable to the using of high current driving. Therein, said current blocking area 352 can advance the efficiency of horizontal current spreading, thus further prompting the external luminous efficiency.

EXAMPLE 6

In another embodiment of the present invention, in which the embodiments of example 2 and 3 are combined together, at the same time, it includes the surfaces of the textured N-type transparent metal oxide layer 400 and the textured N-type AlInGaN ohmic contact layer 322, as shown in FIG. 8.

EXAMPLE 7

In another embodiment of the present invention, wherein the embodiments of example 2 and 4 are combined together, the textured N-type transparent metal oxide layer 400 and the current blocking layer 324 on the N-type AlInGaN ohmic contact layer 320 are included as shown in FIG. 9.

EXAMPLE 8

In another embodiment of the present invention, the embodiments of example 2 and 5 are combined together, wherein the textured N-type transparent metal oxide layer 400 and the current blocking layer 352 on the transparent metal ohmic contact layer are included as shown in FIG. 10.

EXAMPLE 9

In another embodiment of the present invention as shown in FIG. 3A, first of all, on the sapphire substrate 300, sequentially epitaxize a low temperature GaN buffer layer 310, a N-type AlInGaN ohmic contact layer 320, a AlInGaN light emitting layer 330, and a P-type AlInGA ohmic contact layer 340. Following, a transparent ohmic contact metal layer 350 and a metal reflection layer 360 are subsequently formed on the P-type AlInGaN ohmic contact layer 340 by evaporating or sputtering as shown in FIG. 3B. Then another conductive substrate 370 is bonded with said metal reflection layer 360 by thermal bonding as shown in FIG. 3C, and the sapphire substrate 10 is removed by laser liftoff as shown in FIG. 3D. Following, the remaining gallium metal on the surface of N-type AlInGaN ohmic contact layer 12 is removed by chemical etching to expose the N-type AlInGaN ohmic contact layer 320, and then a metal texturing layer 390 is formed on said N-type ohmic contact layer 320 as shown in FIG. 11A. Then, a N-type transparent metal oxide layer 380 is formed on the N-type AlInGaN ohmic contact layer 320 and metal texturing layer 390, and upon finishing, a first electrode 382 and a second electrode 372 are constructed as shown in FIG. 11B.

In conclusion, this invention definitely achieves creativity, improvement, and more usability for the users in the industry. This being the case, it should be qualified for the patent applications in the intellectual patent regulation of our country, thus being proposed for the approval of the patent. Looking forward to the kind rendering of the approval at the earliest convenience.

The above-mentioned practice is only a preferred embodiment of this invention, not the specified limit of it. All the parallel changes and revisions of the shape, the structure, the feature, and the spirit evolving from this invention should be included in the field of the claimed patent of this invention.

Figure 1:
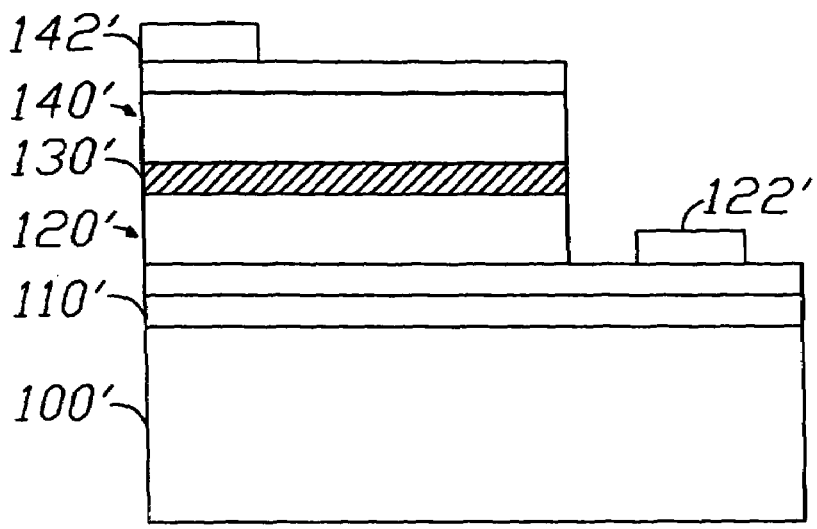
FIG. 1 is the depiction of the conventional GaN-based light emitting diode structure.
Figure 2A:
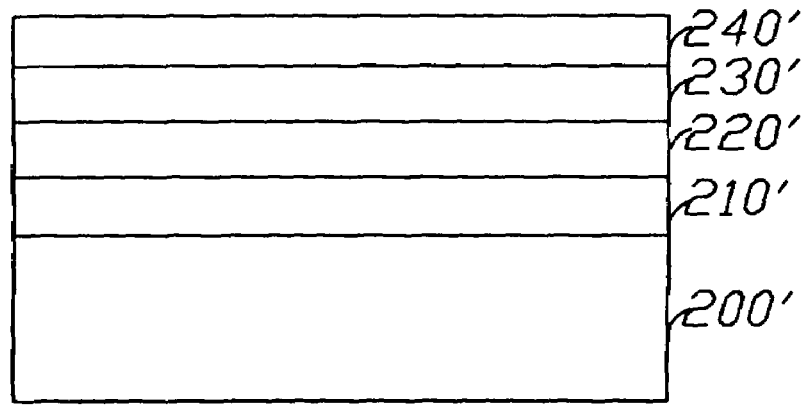
FIG. 2A to FIG. 2C are the depictions of the conventional light emitting diode structure with vertical electrode.
Figure 2B:
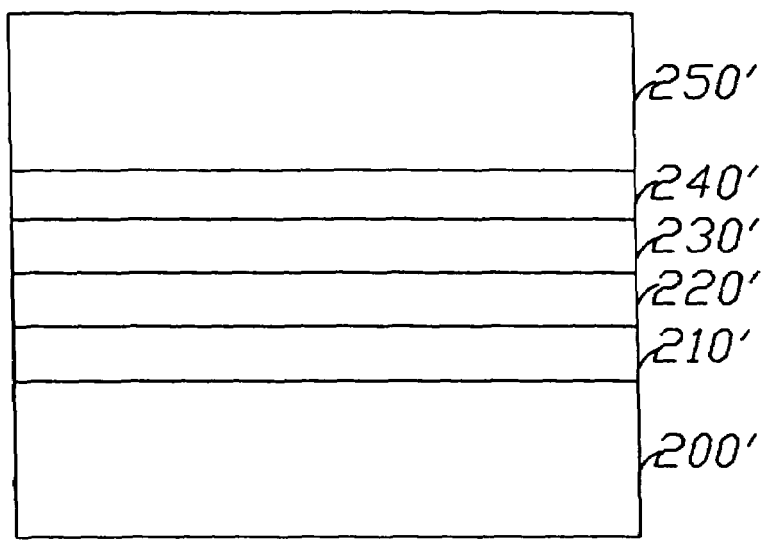
Figure 2C:
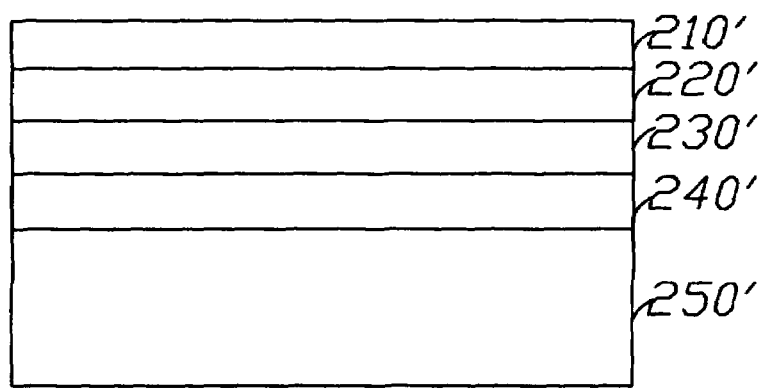
Figure 3A:
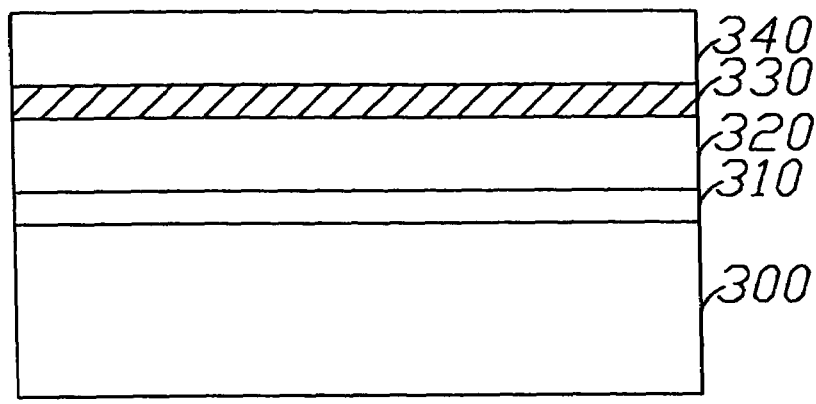
FIG. 3A to FIG. 3F are the depictions about the manufacturing process of the present invention's GaN-based light emitting diode with vertical electrode.
Figure 3B:
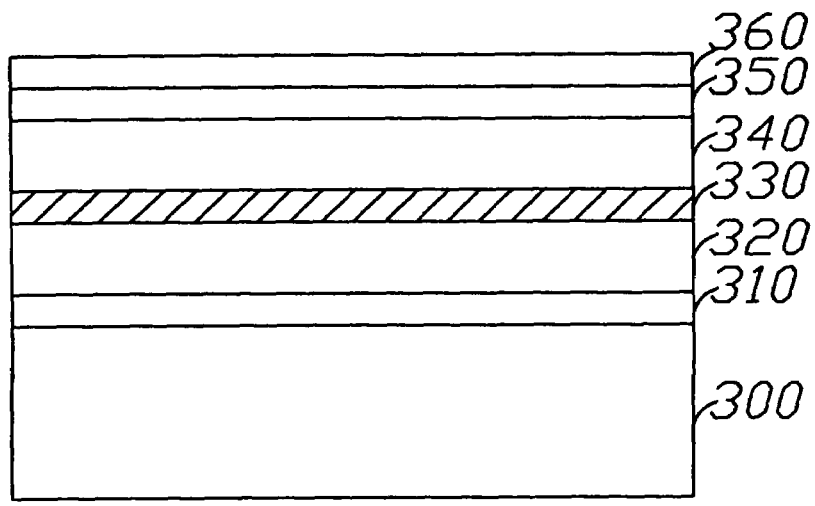
Figure 3C:
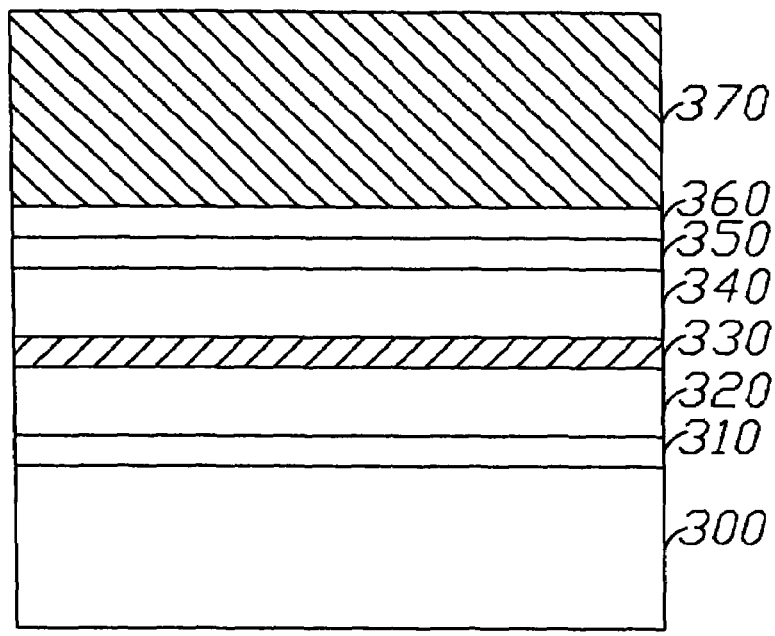
Figure 3D:
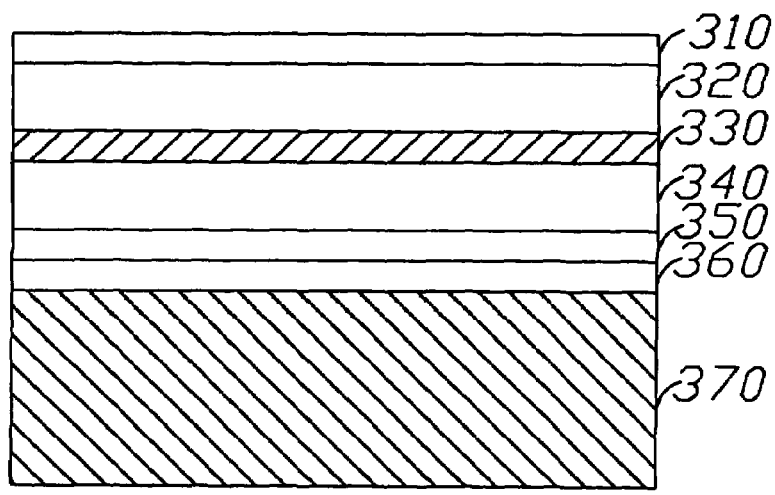
Figure 3E:
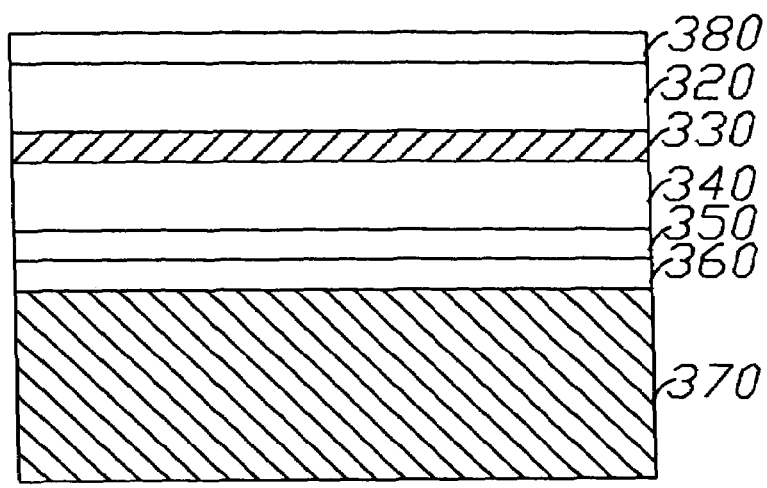
Figure 3F:
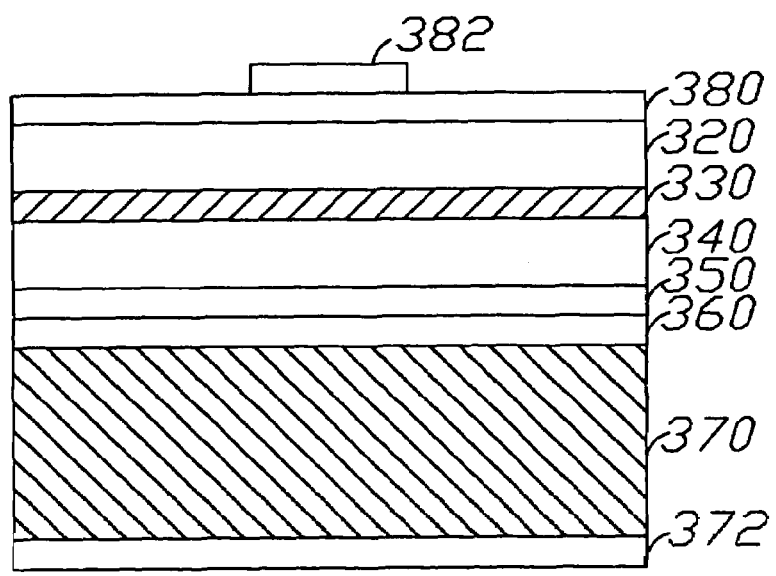
Figure 4:
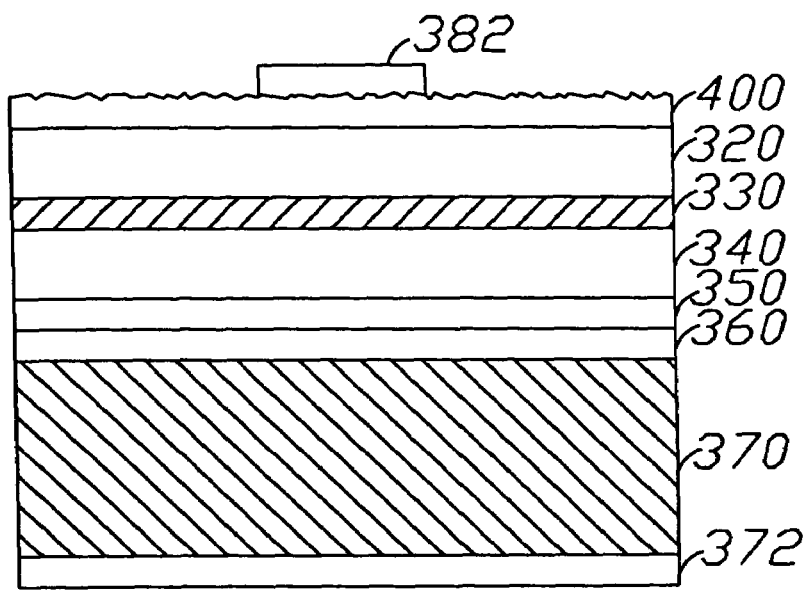
FIG. 4 is the depiction of GaN-based light emitting diode with vertical electrode of the preferred embodiment of this invention.
Figure 6C:
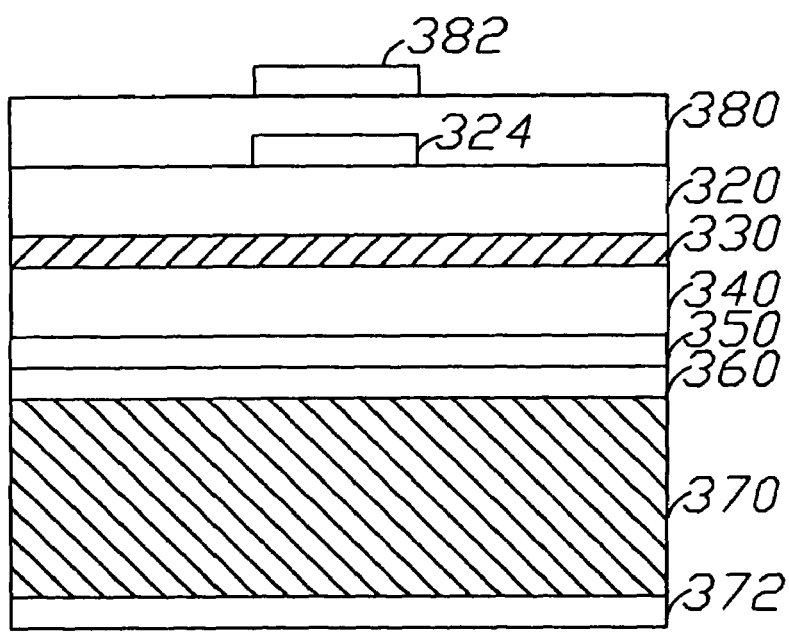
FIG. 6A to FIG. 6C are the depictions about the manufacturing process of GaN-based light emitting diode with vertical electrode of the present invention's another preferred embodiment.
Figure 5A:
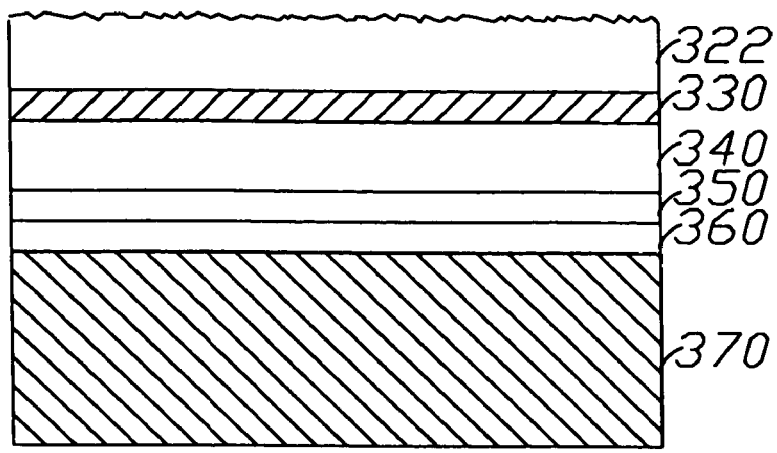
FIG. 5A to FIG. 5B are the depictions about the manufacturing process of GaN-based light emitting diode with vertical electrode of the present invention's another preferred embodiment.
Figure 5B:
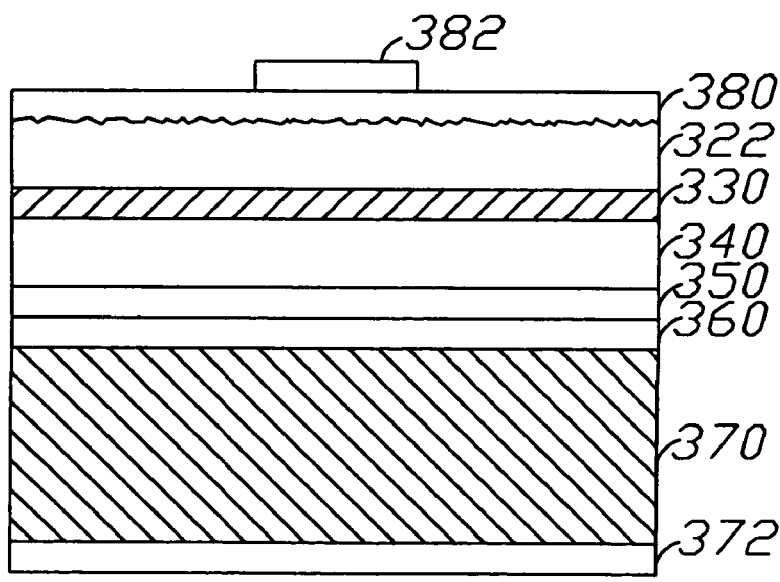
Figure 6A:
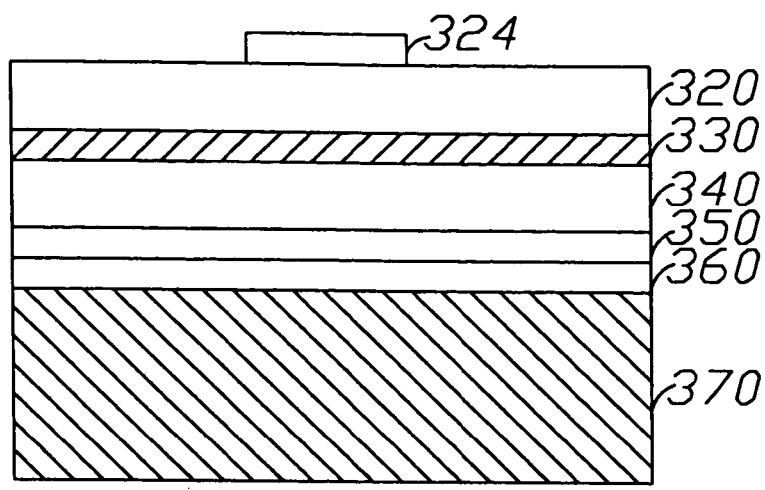
Figure 6B:
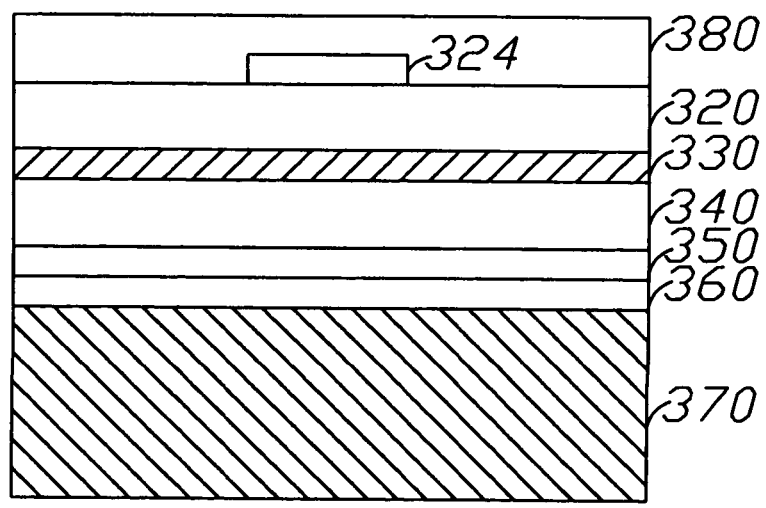
Figure 7A:
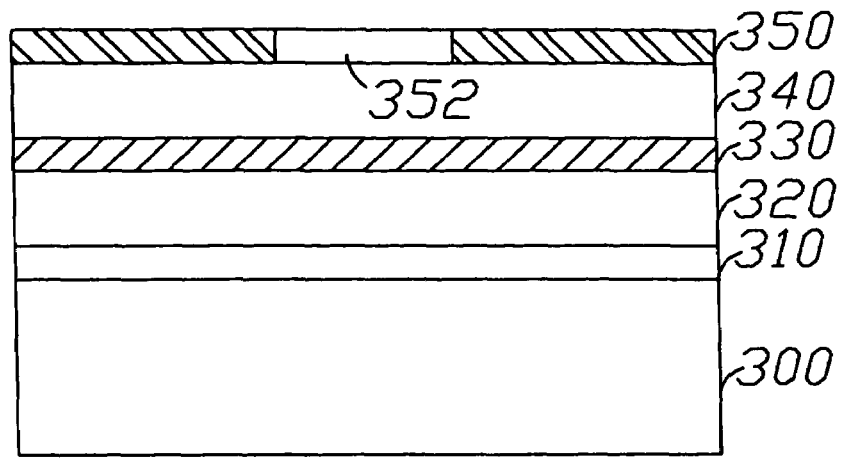
FIG. 7A to FIG. 7E are the depictions about the manufacturing process of GaN-based light emitting diode with vertical electrode of the present invention's another preferred embodiment.
Figure 7B:
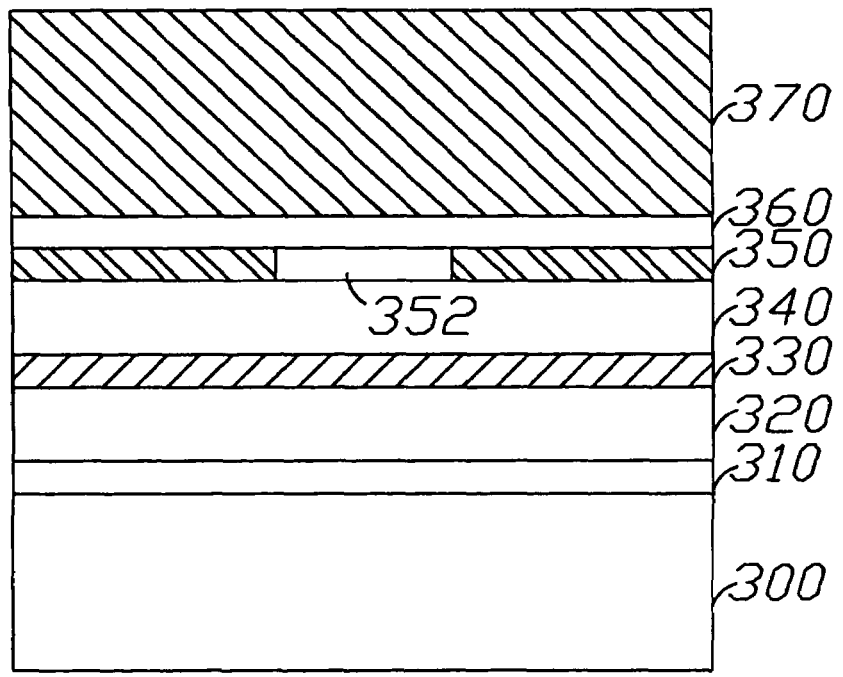
Figure 7C:
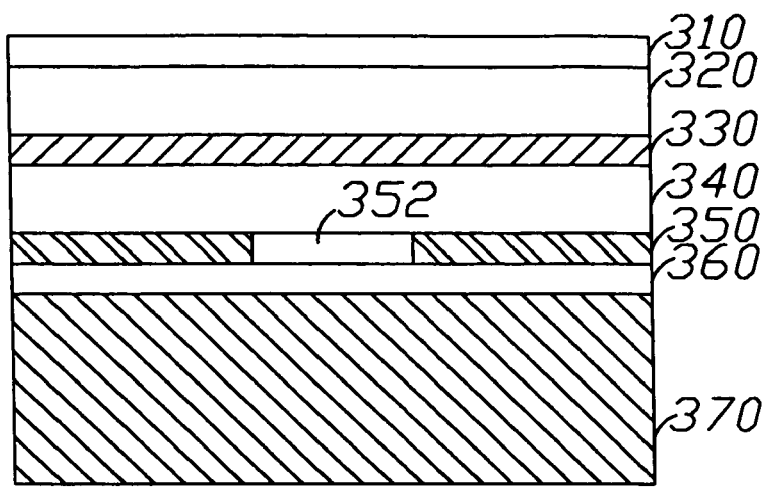
Figure 7D:
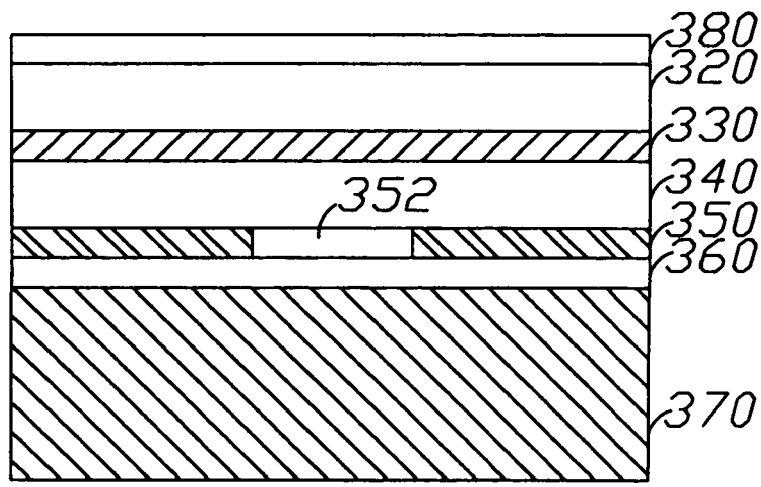
Figure 7E:
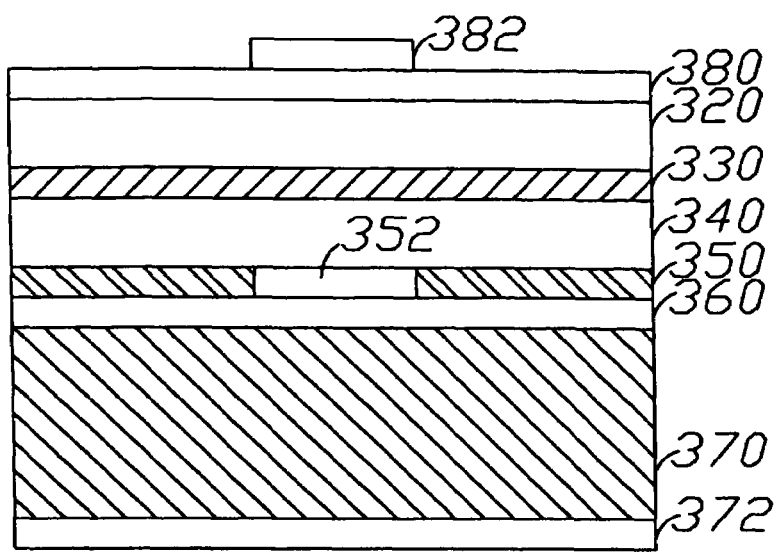
Figure 8:
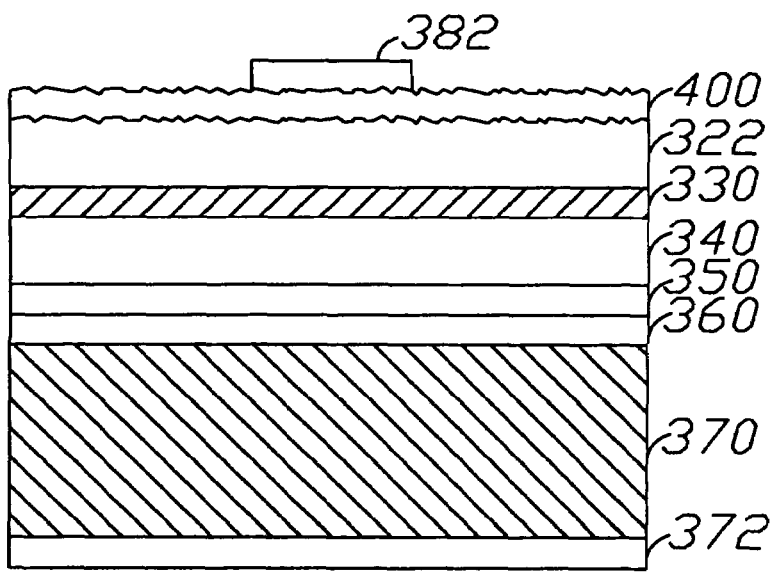
FIG. 8 is the depiction about the structure of GaN-based light emitting diode with vertical electrode of the present invention's another preferred embodiment.
Figure 9:
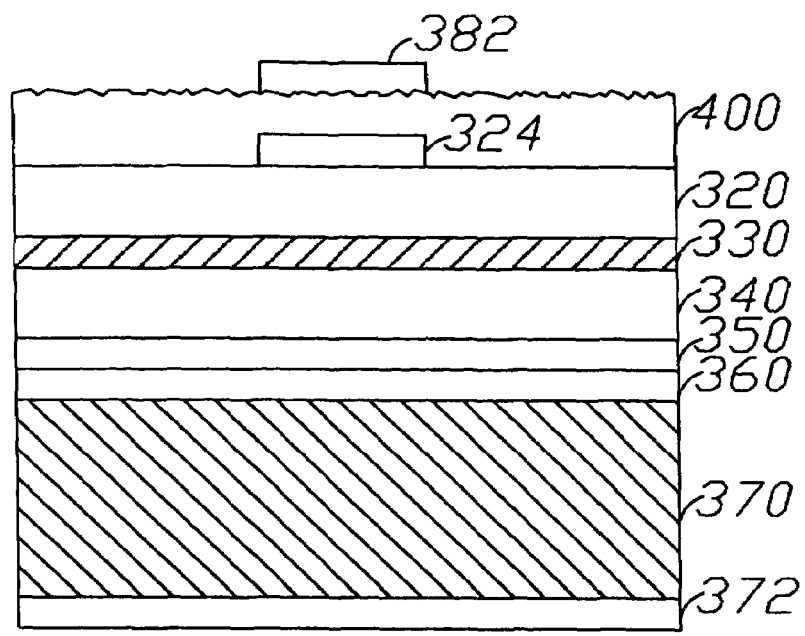
FIG. 9 is the depiction about the structure of the GaN-based light emitting diode with vertical electrode of the present invention's another preferred embodiment.
Figure 10:
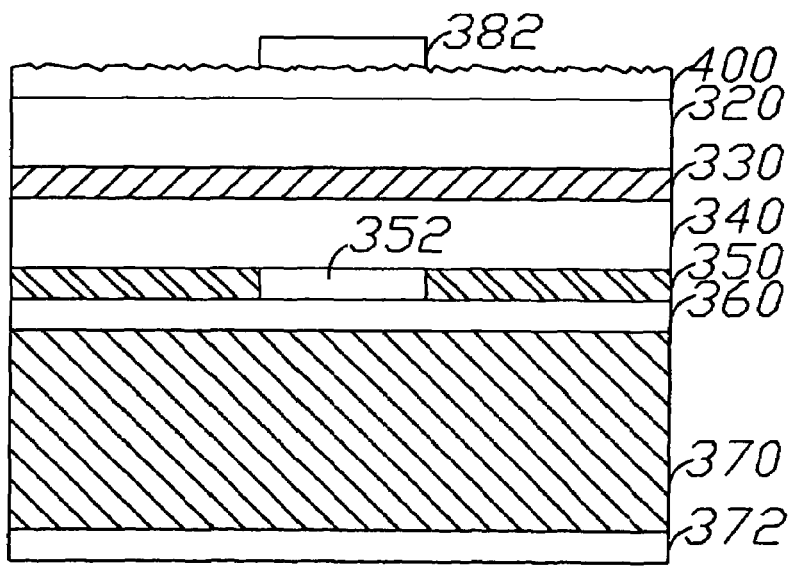
FIG. 10 is the depiction about the structure of the GaN-based light emitting diode with vertical electrode of the present invention's another preferred embodiment.
Figure 11A:
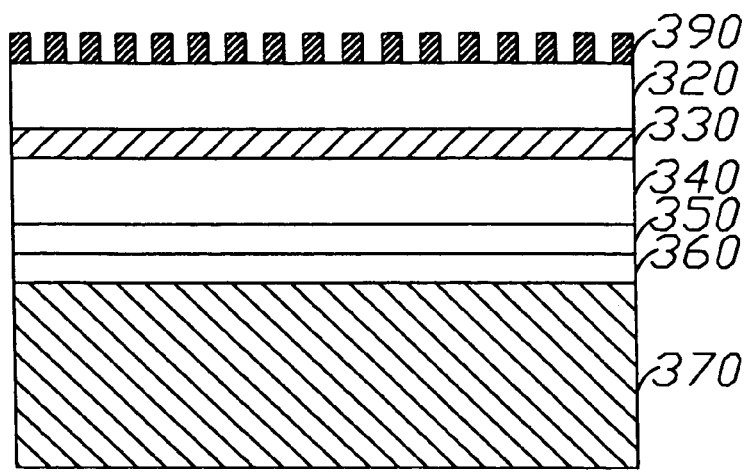
FIG. 11A to FIG. 11B are the depictions about the manufacturing process of GaN-based light emitting diode with vertical electrode of the present invention's another preferred embodiment.
Figure 11B:
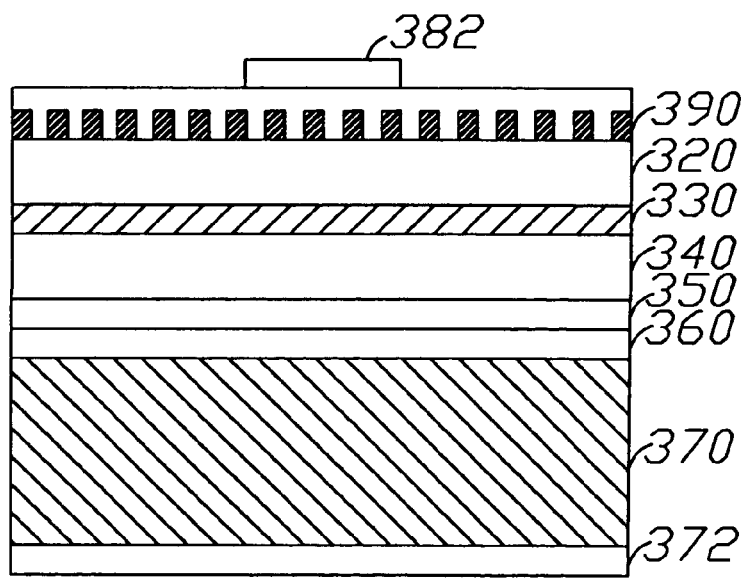

What is claimed is:

1. A vertical electrode structure of a kind of GaN-based light emitting diode, wherein the structure comprising: a first electrode; a conductive substrate with said first electrode there-under; a metal reflecting layer with said conductive substrate there-under; a GaN-based semiconductor stacked structure with said metal reflecting layer there-under, wherein the surface of said GaN-based semiconductor stacked structure has a texturing structure; a oxide window layer with said GaN-based semiconductor stacked structure there-under; and a second electrode with said oxide window layer there-under.

2. The vertical electrode structure of GaN-based light emitting diode as claim in claim 1, wherein said oxide window layer refers a N-type transparent conductive layer, which can be selected from the group consisting of indium tin oxide (ITO), indium molybdenum oxide (IMO), indium oxide, tin oxide, cadmium tin oxide, gallium oxide, indium zinc oxide, gallium zinc oxide, or zinc oxide.

3. The vertical electrode structure of GaN-based light emitting diode as claim in claim 1, wherein the surface of said GaN-based semiconductor stacked structure has a metal texturing layer.

4. The vertical electrode structure of GaN-based light emitting diode as claim in claim 1, wherein a current blocking area is further included between said GaN-based semiconductor stacked structure and said metal reflecting layer.

5. The vertical electrode structure of GaN-based light emitting diode as claim in claim 1, wherein a current blocking layer is further included between said GaN-based semiconductor stacked structure and oxide window layer.

6. The vertical electrode structure of GaN-based light emitting diode as claim in claim 1, wherein said GaN-based semiconductor stacked structure sequentially comprises: a P-type transparent ohmic contact metal layer; a P-type ohmic contact layer; a light emitting layer; and a N-type ohmic contact layer.

* * * * *